(12) United States Patent
Kato

(10) Patent No.: US 7,142,065 B2
(45) Date of Patent: Nov. 28, 2006

(54) CRYSTAL OSCILLATOR DEVICE AND ELECTRONIC APPARATUS USING THE SAME

(75) Inventor: Akira Kato, Takatsuki (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 99 days.

(21) Appl. No.: 10/725,131

(22) Filed: Dec. 1, 2003

(65) Prior Publication Data

US 2004/0155717 A1 Aug. 12, 2004

(30) Foreign Application Priority Data

Feb. 6, 2003 (JP) ............................. 2003-029774

(51) Int. Cl.
*H03B 5/32* (2006.01)
(52) U.S. Cl. ........................................ 331/68; 331/158
(58) Field of Classification Search .................. 331/68, 331/158, 73, 116 R; 310/348
See application file for complete search history.

(56) References Cited

U.S. PATENT DOCUMENTS

| | | | |
|---|---|---|---|
| 3,974,466 A | 8/1976 | Tanaka | |
| 4,220,885 A | 9/1980 | Yamashita et al. | |
| 5,949,294 A | * 9/1999 | Kondo et al. | 331/68 |
| 6,587,008 B1 | * 7/2003 | Hatanaka et al. | 331/68 |
| 2004/0113708 A1 | * 6/2004 | Takanashi et al. | 331/158 |

FOREIGN PATENT DOCUMENTS

| | | |
|---|---|---|
| JP | 05-332399 | 12/1993 |
| JP | 2000-027942 | 1/2000 |

* cited by examiner

*Primary Examiner*—Joseph Chang
(74) *Attorney, Agent, or Firm*—Keating & Bennett, LLP

(57) ABSTRACT

A crystal oscillator device includes a resonator having a plate-shaped resonator package and a plate-shaped circuit board having at least an oscillator circuit. The resonator package is supported above the circuit board such that the resonator package is substantially parallel to the circuit board, and supporting members which support the resonator package are arranged on a straight line on the bottom surface of the resonator package, the straight line being parallel to and near one of the sides of the bottom surface of the resonator package.

15 Claims, 5 Drawing Sheets

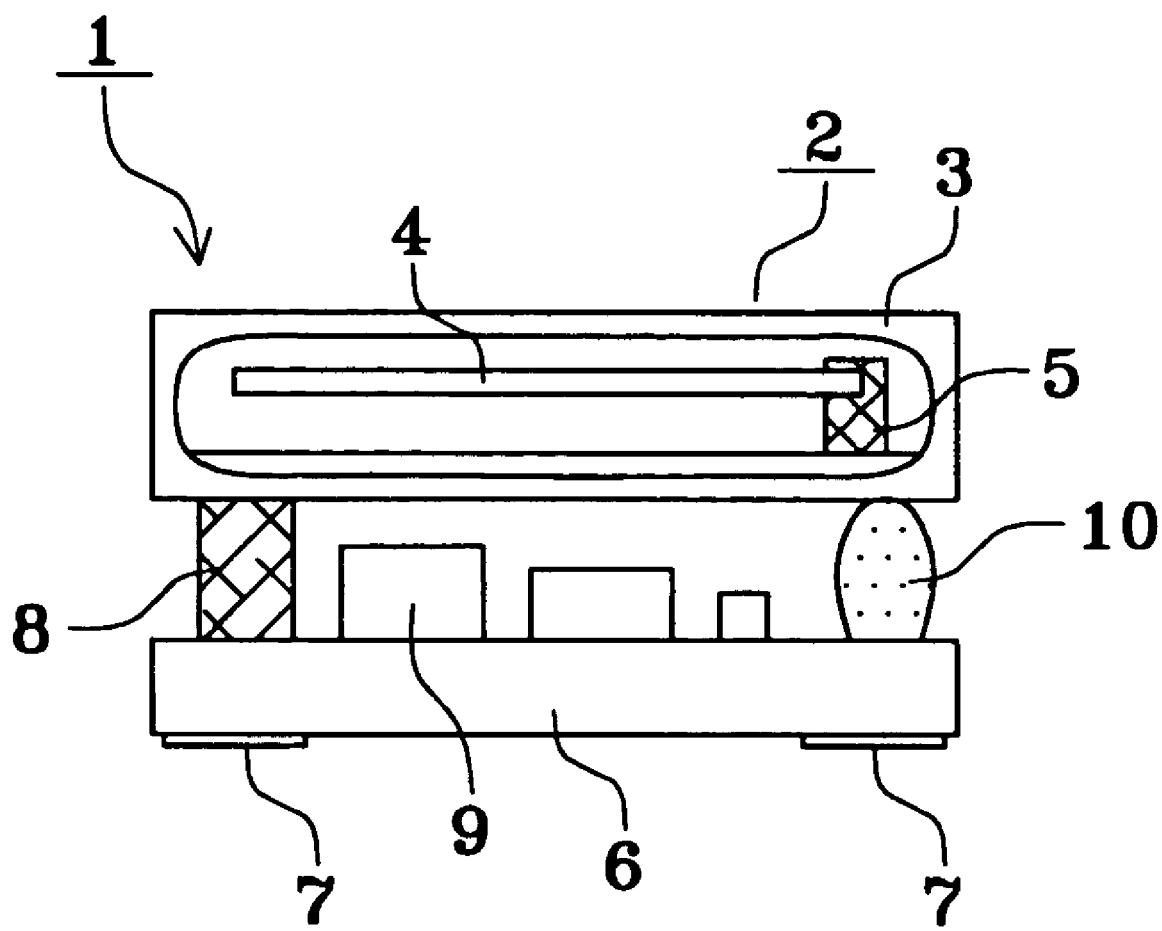

CRYSTAL OSCILLATOR DEVICE AND ELECTRONIC APPARATUS USING THE SAME

BACKGROUND OF THE INVENTION

1. Field of the Invention

The present invention relates to crystal oscillator devices and electronic apparatuses including the crystal oscillator devices, and more specifically, to a crystal oscillator device suitable for use in a vehicle and an electronic apparatus including the crystal oscillator device.

2. Description of the Related Art

When an oscillator device including a crystal resonator is used in a vehicle-mounted apparatus, such as a global positioning system (GPS) used as a navigation system, the oscillation frequency occasionally changes instantaneously due to vibration of the vehicle. This is caused by strong vibration applied to a crystal blank included in the crystal resonator.

The crystal oscillator device is typically used in a cellular phone. Since the cellular phone is usually held in the hand of a user when it is being used, the crystal blank does not receive strong vibration even when the cellular phone is used in a vehicle since the hand of the user acts as a damper. However, since the use of the cellular phone while driving is dangerous, it is desirable to fix the cellular phone to the vehicle. In such a case, there is a risk that a problem similar to that of the GPS will occur.

Accordingly, configurations for preventing strong vibrations of the crystal oscillator device are disclosed in Japanese Unexamined Patent Application Publications Nos. 5-332399 and 2000-27942.

According to the configuration disclosed in the Japanese Unexamined Patent Application Publication No. 5-332399, the entire body of the crystal oscillator device is supported by coil springs arranged radially around the crystal oscillator device.

In addition, according to the configuration disclosed in the Japanese Unexamined Patent Application Publication No. 2000-27942, the entire body of the crystal oscillator device is supported by coil springs arranged only along a direction in which high vibration accelerations are applied.

The configurations according to the above-described publications have outstanding vibration isolation performance since the coil springs are used. However, since the size of the vibration isolation structure is relatively large even when the coil springs are arranged only along a single direction, it is difficult to reduce the size of the crystal oscillator device and save space. In addition, it is difficult to reduce costs of such a structure.

SUMMARY OF THE INVENTION

To overcome the above-described problems, preferred embodiments of the present invention provide a crystal oscillator device having a vibration isolation function which does not inhibit size reduction, and an electronic apparatus including such a novel crystal oscillator device.

A crystal oscillator device according to a preferred embodiment of the present invention includes a crystal resonator having a plate-shaped resonator package, a plate-shaped circuit board having at least an oscillator circuit, the resonator package being supported above the circuit board such that the resonator package is substantially parallel to the circuit board, and supporting members which support the resonator package, the supporting members being arranged along a straight line on the bottom surface of the resonator package.

Preferably, in the crystal oscillator device according to a preferred embodiment of the present invention, the resonator package preferably has a substantially rectangular-plate shape and includes a first side and a second side which oppose each other on the bottom surface of the resonator package, and the straight line along which the supporting members are arranged is along and near the first side. Alternatively, the resonator package may have a substantially rectangular-plate shape and include two opposing sides on the bottom surface of the resonator package, and the straight line on which the supporting members are arranged is a diagonal line of the bottom surface of the resonator package. Alternatively, the resonator package may have a substantially rectangular-plate shape and include two opposing sides on the bottom surface of the resonator package, and the straight line on which the supporting members are arranged is a line between the two opposing sides.

Preferably, in the crystal oscillator device according to preferred embodiments of the present invention, the crystal resonator includes a plate-shaped crystal blank which is provided in the resonator package in a cantilever manner such that the crystal blank is substantially parallel to the resonator package. The crystal blank being retained at retaining positions provided on a straight line which is substantially parallel to the major surfaces of the resonator package, and the straight line on which the supporting members are arranged and a straight line obtained by projecting the straight line which passes through the retaining positions of the crystal blank onto the bottom surface of the resonator package are different from each other. In this case, preferably, the straight line on which the supporting members are arranged and a straight line obtained by projecting the straight line which passes through the retaining positions of the crystal blank onto the bottom surface of the resonator package are substantially parallel to each other.

Preferably, in the crystal oscillator device according to preferred embodiments of the present invention, the crystal resonator includes a plate-shaped crystal blank which is provided in the resonator package in a cantilever manner such that the crystal blank is substantially parallel to the resonator package, the crystal blank being retained at retaining positions on a straight line which is substantially parallel to the major surfaces of the resonator package, and a straight line obtained by projecting the straight line which passes through the retaining positions of the crystal blank onto the bottom surface of the resonator package is along and near the second side of the bottom surface of the resonator package.

Thus, in the crystal oscillator device according to preferred embodiments of the present invention, the impact applied to the crystal oscillator device is not easily transmitted to the crystal blank in the crystal resonator. As a result, the instantaneous change in the oscillation frequency due to the impact is greatly reduced and the size and cost of the crystal oscillator device are not increased.

An electronic apparatus according to another preferred embodiment of the present invention includes the crystal oscillator device which is constructed as described above.

Since the crystal oscillator device according to preferred embodiments of the present invention is constructed as described above, the instantaneous change in the oscillation frequency due to impact is greatly reduced.

In addition, since the electronic apparatus according to a preferred embodiment of the present invention includes the crystal oscillator device according to other preferred embodiments of the present invention, the possibility of malfunction due to impact is greatly reduced.

Further elements, characteristics, features and advantages of the present invention will become apparent from the following description of the preferred embodiments with reference to the attached drawings.

BRIEF DESCRIPTION OF THE DRAWINGS

FIG. 1 is a partially broken side view showing a crystal oscillator device according to a preferred embodiment of the present invention;

DETAILED DESCRIPTION OF PREFERRED EMBODIMENTS

Figure 2A:
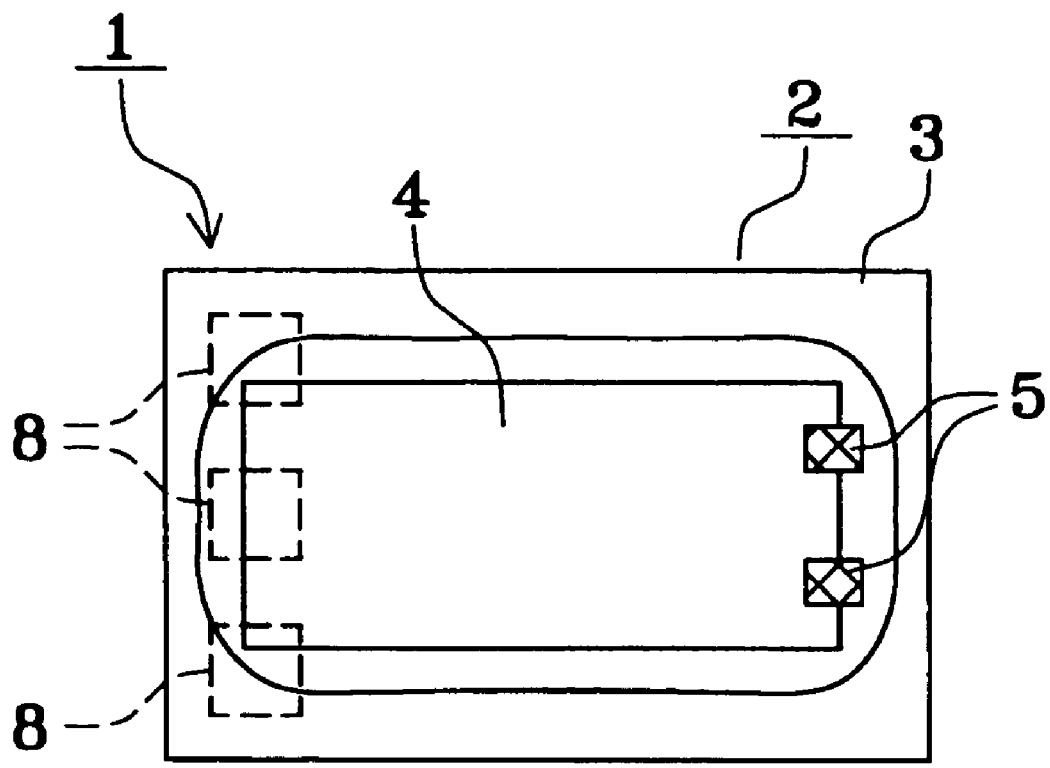
FIG. 2A is a partially broken plan view of the crystal oscillator device shown in FIG. 1

FIG. 1 is a partially broken side view of a crystal oscillator device according to a preferred embodiment of the present invention. With reference to FIG. 1, a crystal oscillator device 1 includes a crystal resonator 2 having a substantially rectangular-plate-shaped resonator package 3 and a substantially rectangular-plate-shaped circuit board 6 whose shape is approximately the same as the planar shape of the resonator package 3. In FIG. 1, only the crystal resonator 2 is shown as a partially broken view such that the internal structure thereof is shown.

External connection electrodes 7 are provided on the bottom surface of the circuit board 6, and a circuit component 9 which defines an oscillator circuit is mounted on the top surface of the circuit board 6. The crystal resonator 2 is supported above the top surface of the circuit board 6 by supporting members 8 such that the resonator package 3 is substantially parallel to the circuit board 6. The supporting members 8 not only support the crystal resonator 2, but also provide electrical connection between the crystal resonator 2 and circuits provided on the circuit board 6.

The crystal resonator 2 preferably includes a substantially rectangular-plate-shaped crystal blank 4. The crystal blank 4 is disposed in the resonator package 3 such that the crystal blank 4 is retained by retainers 5 at one side thereof in a cantilever manner and is substantially parallel to the resonator package 3. The retainers 5 not only retain the crystal blank 4, but also provide electrical connection between electrodes provided on the crystal blank 4 and connection electrodes which are provided on the bottom surface of the resonator package 3 and which are connected to the supporting members 8.

Figure 2B:
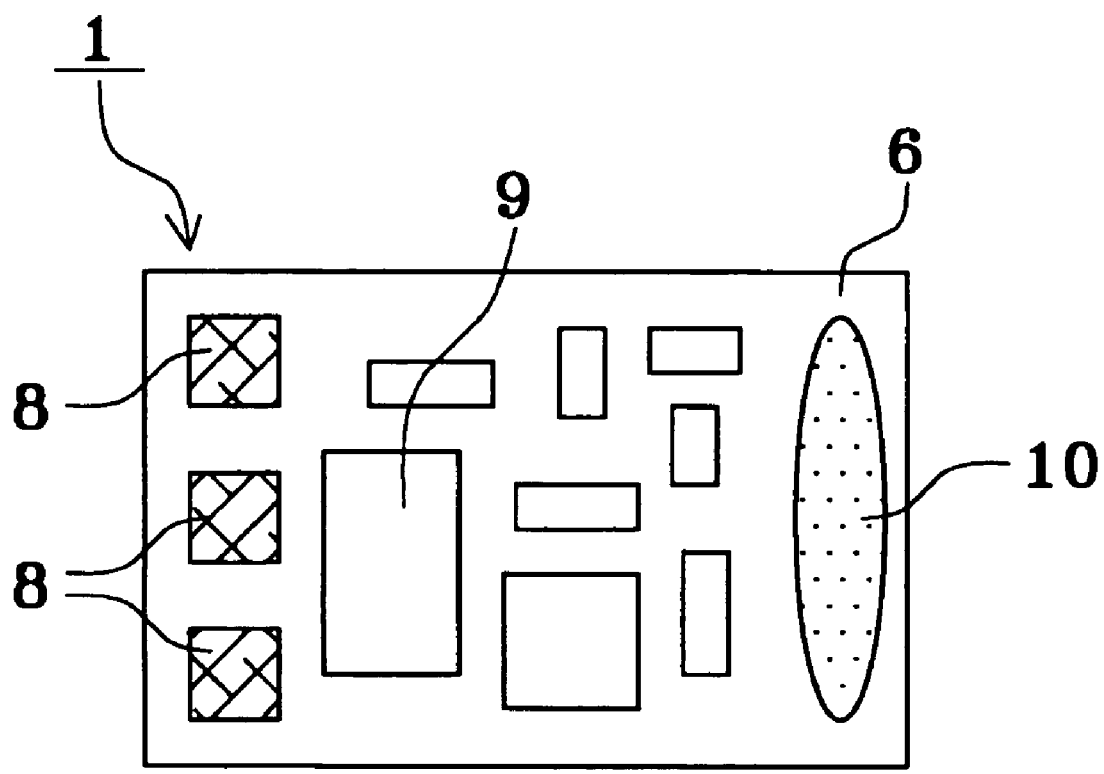
FIG. 2B is a plan view of the crystal oscillator device shown in FIG. 1 in the state in which only the crystal resonator is removed.

FIG. 2A is a partially broken plan view of the crystal oscillator device 1, and FIG. 2B is a plan view of the crystal oscillator device 1 in which the crystal resonator 2 is removed. The structure of the crystal oscillator device 1 will be described in more detail below with reference to FIGS. 1 and 2A. In FIG. 2A, only the crystal resonator 2 is shown as a partially broken view such that the internal structure thereof is clearly shown.

Three prismatic supporting members 8 are arranged on a straight line which is substantially parallel to and near one of the sides of the substantially rectangular bottom surface of the resonator package 3. Accordingly, the resonator package 3 is supported above the circuit board 6 by the supporting members 8 in a cantilever manner. Since the planar shape of the resonator package 3 is approximately the same as that of the circuit board 6, the supporting members 8 are also arranged on a straight line which is substantially parallel to and near one of the sides of the circuit board 6.

The substantially rectangular-plate-shaped crystal blank 4 is disposed in the resonator package 3 such that the crystal blank 4 is retained by the retainers 5 at one side thereof in a cantilever manner. The retainers 5 retain the crystal blank 4 at two positions on one of the sides of the crystal blank 4, and the line connecting the two retaining positions is substantially parallel to that side of the crystal blank 4. In addition, since the planar shape of the crystal blank 4 is slightly smaller but similar to that of the resonator package 3, a line obtained by projecting the line connecting the retaining positions of the crystal blank 4 onto the bottom surface of the resonator package 3 is substantially parallel to and near the side of the bottom surface of the resonator package 3 which is opposite to the side along which the supporting members 8 are arranged.

In addition, a resin member 10 is disposed between the resonator package 3 and the circuit board 6 such that the resin member 10 is in contact with both of, but does not provide electrical connection between, the resonator package 3 and the circuit board 6 at a location near the side of the bottom surface of the resonator package 3 which is opposite to the side along which the supporting members 8 are arranged.

In the crystal oscillator device 1 which is constructed as described above, when an impact is applied to the entire body of the crystal oscillator device 1 in the vertical direction (the thickness direction of the circuit board 6), the circuit board 6, the supporting members 8 and the circuit component 9 mounted on the circuit board 6 receive the impact at the same time. However, although the resonator package 3 receives the same impact on the side at which it is supported by the supporting members 8, the impact applied to the resonator package 3 on the opposite side is substantially reduced since the resonator package 3 is supported by the supporting members 8 in a cantilever manner. This is because the resonator package 3 vibrates with respect to the supporting members 8 and thereby absorbs the impact energy. The resin member 10 absorbs the vibrational energy of the resonator package 3 such that the impact energy is not completely transmitted to the resonator package 3.

Similarly, the crystal blank 4 is retained in a cantilever manner in the resonator package 3. In addition, since the retainers 5 are arranged near the side opposite to the side along which the supporting members 8 are arranged, the impact is not directly transmitted to the retainers 5 of the crystal blank 4, and the vibrational energy corresponding to the impact energy which is substantially reduced is applied to the retainers 5. Although the crystal blank 4 receives the same vibration as that applied to the retainers 5 on the side at which it is supported by the retainers 5, vibration applied to the crystal blank 4 on the opposite side is greatly reduced since the crystal blank 4 is retained by the retainers 5 in a cantilever manner. This is because the crystal blank 4 vibrates with respect to the retainers 5 and thereby absorbs some of the vibrational energy. Accordingly, the vibrational energy applied to the crystal blank 4 on the side opposite to the side at which it is retained by the retainers 5 is greatly reduced as compared to the impact energy applied to the crystal oscillator device 1.

As described above, in the crystal oscillator device 1, since the supporting members 8 which support the resonator package 3 are arranged on a straight line near one of the sides of the bottom surface of the resonator package 3, the impact energy applied to the crystal oscillator device 1 is reduced before it is transmitted to the crystal blank 4. In addition, since a straight line obtained by projecting the straight line which passes through the retaining positions of the crystal blank 4 onto the bottom surface of the resonator package 3 is parallel to and near the side opposite to the side near the straight line on which the supporting members 8 are arranged, the impact energy applied to the crystal blank 4 is further reduced. Accordingly, the possibility that the oscillation frequency will instantaneously change due to the impact applied to the crystal oscillator device 1 is greatly reduced.

In addition, since it is not necessary to use coils springs as in the above-described known configurations, the size and cost of the device are not increased.

The straight line obtained by projecting the straight line which passes through the retaining positions of the crystal blank 4 onto the bottom surface of the resonator package 3 may also be the same as the straight line on which the supporting members 8 are arranged, although the ability to absorb the impact applied to the crystal blank 4 will be reduced in this case.

Figure 3:
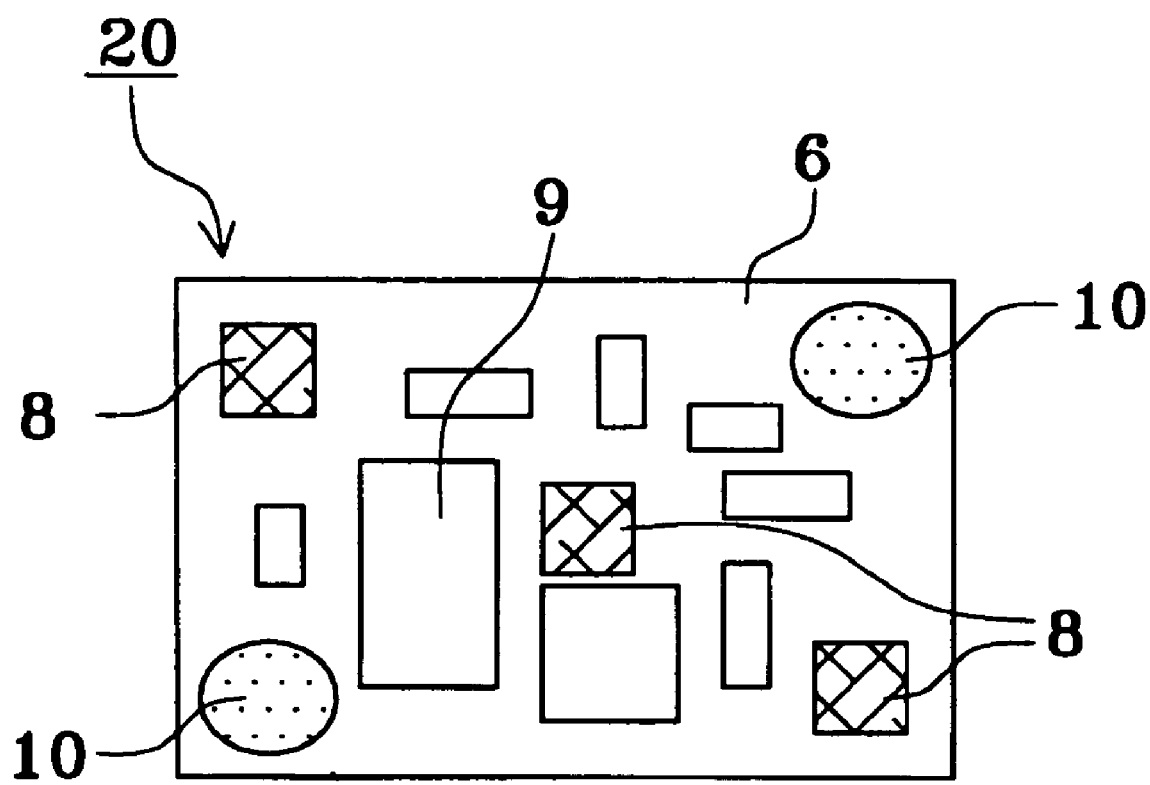
FIG. 3 is a plan view of a crystal oscillator device according to another preferred embodiment of the present invention in the state in which a crystal resonator is removed.

FIG. 3 is a plan view showing a crystal oscillator device according to another preferred embodiment of the present invention. Similar to FIG. 2B, FIG. 3 shows a device in which a crystal resonator is removed. The crystal resonator is similar to that shown in FIG. 2. In FIG. 3, components which are the same as or similar to those shown in FIG. 2 are denoted by the same reference numerals, and explanations thereof are thus omitted.

In a crystal oscillator device 20 shown in FIG. 3, three supporting members 8 are arranged on a diagonal line of the top surface of a circuit board 6. Since a crystal resonator 2 whose shape is approximately the same as that of the circuit board 6 is mounted on the supporting members 8, the supporting members 8 are also arranged on a diagonal line of the bottom surface of the resonator package. In addition, two resin members 10 are disposed between the circuit board 6 and the resonator package, one at each of the corners at the ends of a diagonal line other than that on which the supporting members 8 are arranged on the circuit board 6.

As described above, in the crystal oscillator device 20, since the supporting members 8 are arranged on a straight line on the bottom surface of the resonator package, portions of the resonator package arranged on the resin members 10 alternately move up and down and vibrate in the vertical direction with respect to the supporting members 8. Therefore, the impact energy applied to the crystal oscillator device 20 is reduced before it is applied to the crystal blank. In addition, since the straight line on which the supporting members 8 are arranged and the straight line connecting the retaining positions of the crystal blank are different from each other, although they are not parallel to each other, the impact energy applied to the crystal blank is further reduced. Accordingly, the possibility that the oscillation frequency will instantaneously change due to the impact applied to the crystal oscillator device is greatly reduced. In addition, similar to the crystal oscillator device 1, the size and cost are greatly reduced.

Figure 4:
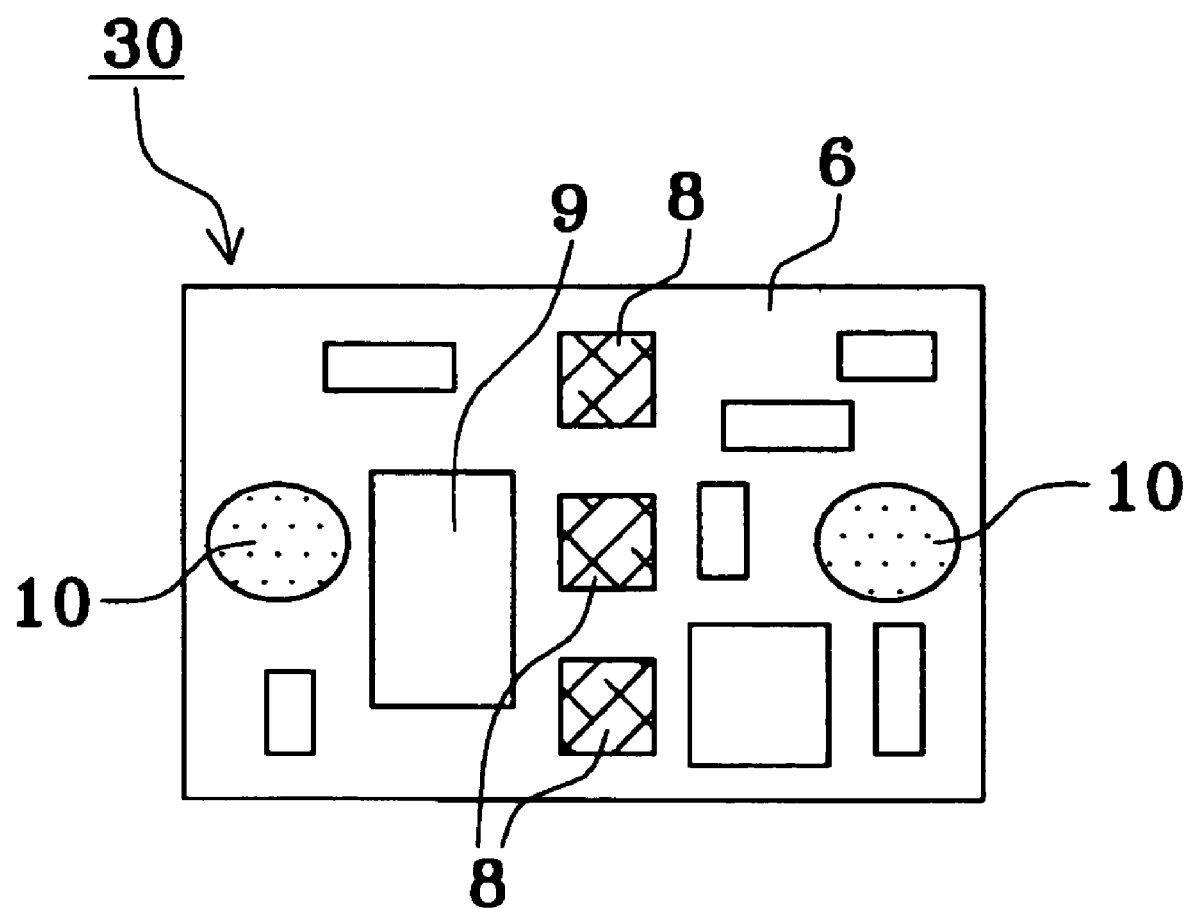
FIG. 4 is a plan view of a crystal oscillator device according to another preferred embodiment of the present invention in the state in which a crystal resonator is removed.

FIG. 4 is a plan view showing a crystal oscillator device according to another preferred embodiment of the present invention. Similar to FIG. 2B, FIG. 4 shows a device in which a crystal resonator is removed. The crystal resonator is similar to that shown in FIG. 2. In FIG. 4, components which are similar to those shown in FIG. 2 are denoted by the same reference numerals, and explanations thereof are thus omitted.

In a crystal oscillator device 30 shown in FIG. 4, three supporting members 8 are arranged on a centerline between two opposing sides of the top surface of a circuit board 6. Since a crystal resonator 2 whose shape is approximately the same as that of the circuit board 6 is mounted on the supporting members 8, the supporting members 8 are arranged on a centerline between two opposing sides of the bottom surface of the resonator package. In addition, two resin members 10 are disposed between the circuit board 6 and the resonator package, one at each of the centers of the two opposing sides which are substantially parallel to the straight line on which the supporting members 8 are arranged on the circuit board 6.

As described above, in the crystal oscillator device 30, since the supporting members 8 are arranged on a straight line on the bottom surface of the resonator package, portions of the resonator package arranged on the resin members 10 alternately move up and down and vibrate in the vertical direction with respect to the supporting members 8. Therefore, the impact energy applied to the crystal oscillator device 30 is reduced before it is applied to the crystal blank. In addition, since the straight line on which the supporting members 8 are arranged and the straight line connecting the retaining positions of the crystal blank are parallel to each other, the impact energy applied to the crystal blank is further reduced. Accordingly, the possibility that the oscillation frequency will instantaneously change due to the impact applied to the crystal oscillator device is greatly reduced. In addition, similar to the crystal oscillator device 1, the size and cost are reduced.

In the above-described preferred embodiments, one or more resin members 10 are disposed under the resonator package. However, the resin members 10 may also be omitted, although the ability to absorb vibration will be reduced in this case.

When the resin members 10 are omitted, there is a possibility that the bottom surface of the resonator package will come into contact with the circuit board 6 or a portion of the circuit component 9 mounted on the circuit board 6. Accordingly, a portion of the bottom surface of the resonator package, more specifically, a portion at the farthest position from the straight line on which the supporting members 8 are arranged may be cut in order to provide enough clearance for the vibration of the resonator package which occurs when the impact is applied. Alternatively, the circuit board 6 may also be cut at a location under this portion.

Figure 5:
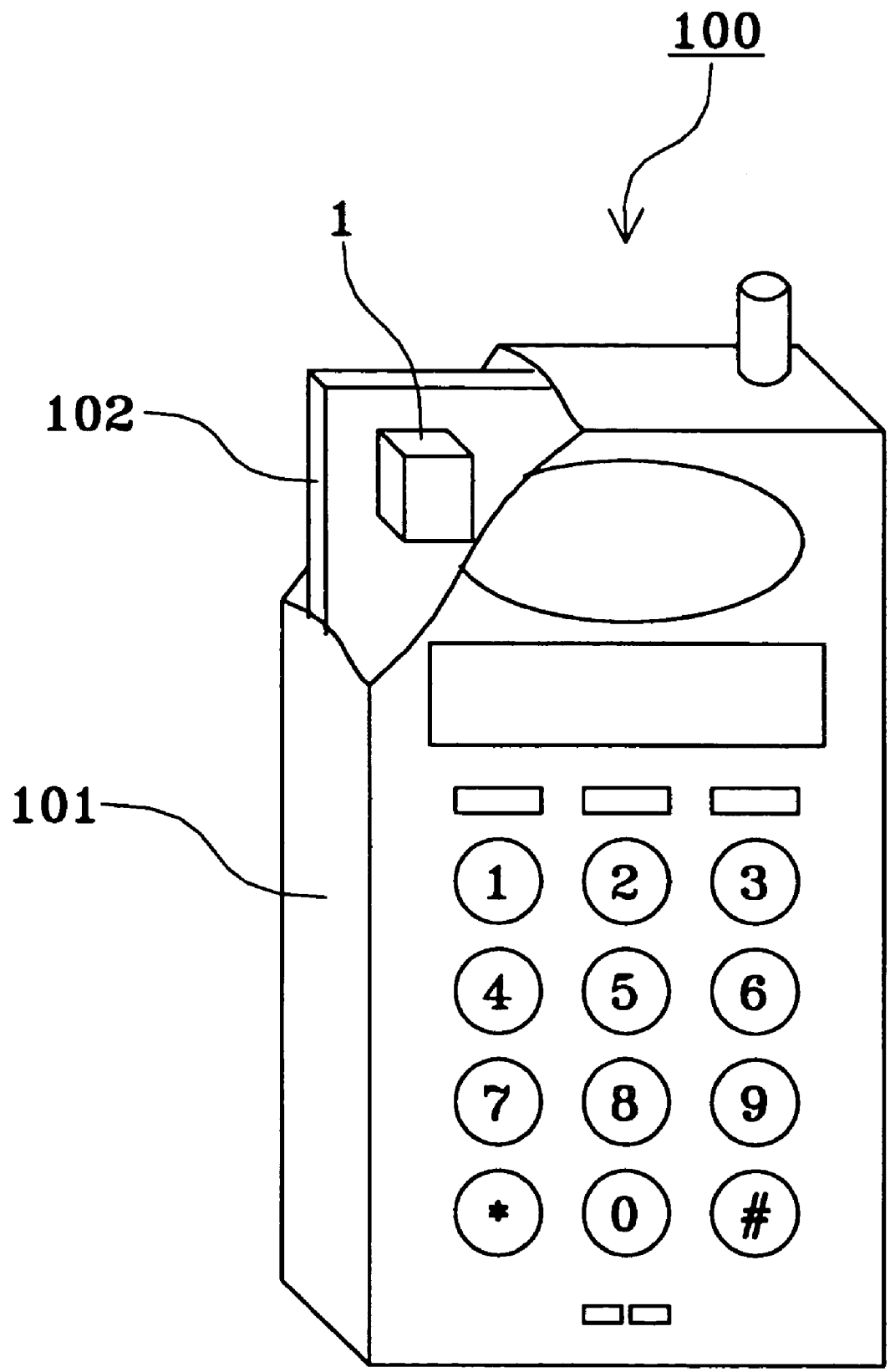
FIG. 5 is a perspective view showing a preferred embodiment of an electronic apparatus according to the present invention.

FIG. 5 is a perspective view showing a preferred embodiment of an electronic apparatus according to the present invention. In FIG. 5, a cellular phone 100, which is an example of an electronic apparatus, includes a housing 101, a printed circuit board 102 disposed in the housing 101, and the crystal oscillator device 1 according to preferred embodiments of the present invention which is mounted on the printed circuit board 102 so as to define a reference signal source.

Since the cellular phone 100 configured as described above includes the crystal oscillator device 1 according to preferred embodiments of the present invention, the possibility of malfunction due to the impact is greatly reduced.

Although a cellular phone is shown in FIG. 5 as an example of an electronic apparatus, the electronic apparatus is not limited to a cellular phone, and may be any kind of apparatus as long as the crystal oscillator device according to preferred embodiments of the present invention is used.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

What is claimed is:

1. A crystal oscillator device comprising:
a crystal resonator having a resonator package, the resonator package including a resonating member and a retaining member supporting the resonating member in the resonator package;
a circuit board having an oscillator circuit;
at least one supporting member arranged between the resonator package and the circuit board to support the resonator package above the circuit board such that the resonator package is spaced away from the circuit board, wherein at least one portion of at least one side of the resonator package is not supported by the at least one supporting member; and
a vibrational energy absorbing member made of a vibrational energy absorbing material arranged between the resonator package and the circuit board so as to absorb vibrational energy of the resonator package; wherein
the vibrational energy absorbing member provides no electrical connection between the resonating member and the oscillating circuit.

2. The crystal oscillator device according to claim 1, wherein a space is defined between the resonator package and the circuit board, and further comprising electronic components disposed on the circuit board and located within said space.

3. The crystal oscillator device according to claim 1, wherein the at least one supporting member includes a plurality of supporting members that mechanically support the resonator package above and spaced from the circuit board and electrically connect the resonating member to the oscillating circuit.

4. The crystal oscillator device according to claim 1, wherein the retaining member supports the resonating member in a cantilevered manner.

5. The crystal oscillator device according to claim 1, wherein said at least one supporting member is arranged along one end of the resonator package and the retaining member supports the resonating member in a cantilevered manner at retaining positions along a second end of the resonator package opposite to the first end of the resonator package.

6. The crystal oscillator device according to claim 1, wherein the at least one supporting member includes a plurality of supporting members arranged along a diagonal line between a first set of opposing corners of the resonator package and the circuit board, and a plurality of the vibrational energy absorbing members are arranged along a diagonal line between a second set of different opposing corners of the resonator package and the circuit board.

7. The crystal oscillator device according to claim 1, wherein the at least one supporting member includes a plurality of supporting members arranged along a line between a first set of two opposing sides of the resonator package and the circuit board, and a plurality of the vibrational energy absorbing members are arranged along a line between a second set of different opposing sides of the resonator package and the circuit board.

8. An electronic apparatus comprising a crystal oscillator device according to claim 1.

9. The crystal oscillator device according to claim 1, wherein the at least one supporting member includes a plurality of separate, spaced apart supporting members extending between the resonator package and the circuit board.

10. The crystal oscillator device according to claim 9, wherein said separate, spaced apart supporting members extending between the resonator package and the circuit board are arranged in a straight line along one end of the resonator package.

11. The crystal oscillator device according to claim 9, wherein said separate, spaced apart supporting members extending between the resonator package and the circuit board are arranged along a diagonal line between opposing corners of the resonator package and the circuit board.

12. The crystal oscillator device according to claim 9, wherein said separate, spaced apart supporting members extending between the resonator package and the circuit board are arranged along a line extending between opposing sides of the resonator package and the circuit board.

13. A crystal oscillator device comprising:
a crystal resonator having a resonator package, the resonator package including a resonating member and a retaining member supporting the resonating member in the resonator package;
a circuit board having an oscillator circuit;
at least one supporting member arranged between the resonator package and the circuit board to support the resonator package above the circuit board such that the resonator package is spaced away from the circuit board, wherein at least one portion of at least one side of the resonator package is not supported by the at least one supporting member; and
a vibrational energy absorbing member made of a vibrational energy absorbing material arranged between the resonator package and the circuit board so as to absorb vibrational energy of the resonator package; wherein
the at least one supporting member includes a plurality of supporting members arranged along a first end of the resonator package, and the vibrational energy absorbing member is arranged at a second end of the resonator package opposite to the first end of the resonator package; and
the vibrational energy absorbing member arranged at the second end of the resonator package is the only member arranged at the second end of the resonator package that is in contact with both the resonator package and the circuit board.

14. The crystal oscillator device according to claim 13, wherein the retaining member supports the resonating member in a cantilevered manner at retaining positions along the second end of the resonator package opposite to the first end of the resonator package.

15. The crystal oscillator device according to claim 14, wherein a line passing through the plurality of supporting members arranged along the first end of the resonator package is parallel to a line passing through the retaining positions along the second end of the resonator package.

* * * * *